United States Patent [19]

Ransom et al.

[11] Patent Number: 4,496,856
[45] Date of Patent: Jan. 29, 1985

[54] GAAS TO ECL LEVEL CONVERTER

[75] Inventors: Stephen A. Ransom, Huntingdon Valley; Tedd K. Stickel, Chalfont, both of Pa.

[73] Assignee: Sperry Corporation, New York, N.Y.

[21] Appl. No.: 400,514

[22] Filed: Jul. 21, 1982

[51] Int. Cl.³ .................. H03K 19/092; H03K 19/094
[52] U.S. Cl. .................................... 307/475; 307/264; 307/455; 307/448
[58] Field of Search ............... 307/475, 264, 455, 448, 307/458, 467, 468

[56] References Cited

U.S. PATENT DOCUMENTS 4,410,815 10/1983 Ransom et al. ..................... 307/475

Primary Examiner—John Zazworsky
Attorney, Agent, or Firm—John B. Sowell; Thomas J. Scott; Marshall M. Truex

[57] ABSTRACT

An improved high speed gallium arsenide (GaAs) to emitter coupled logic (ECL) voltage level converter is provided which consumes less power and also provides an improved speed-power product performance characteristic. The converter includes a three branch output circuit which emulates the operation of an ECL output driver. The emulator circuit causes faster switching by compensating for parasitic resistances and capacitance and is also provided with a gate discharge network which reduces switching time of the ECL output emulator.

10 Claims, 5 Drawing Figures

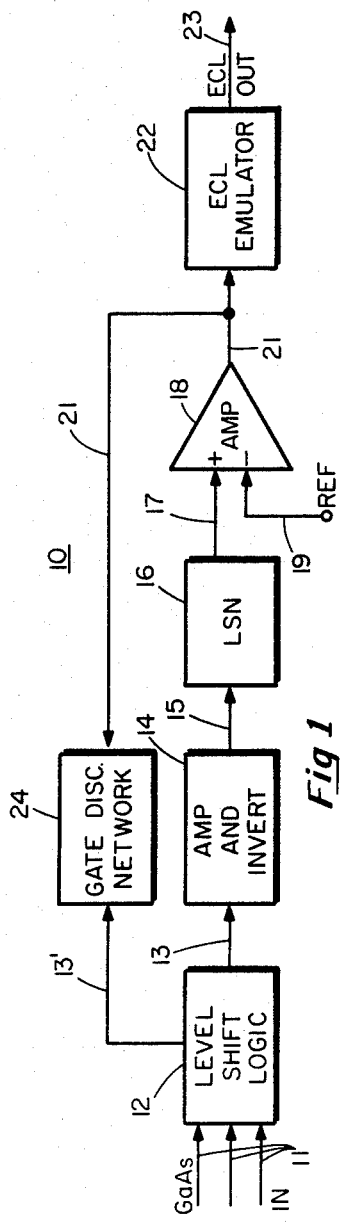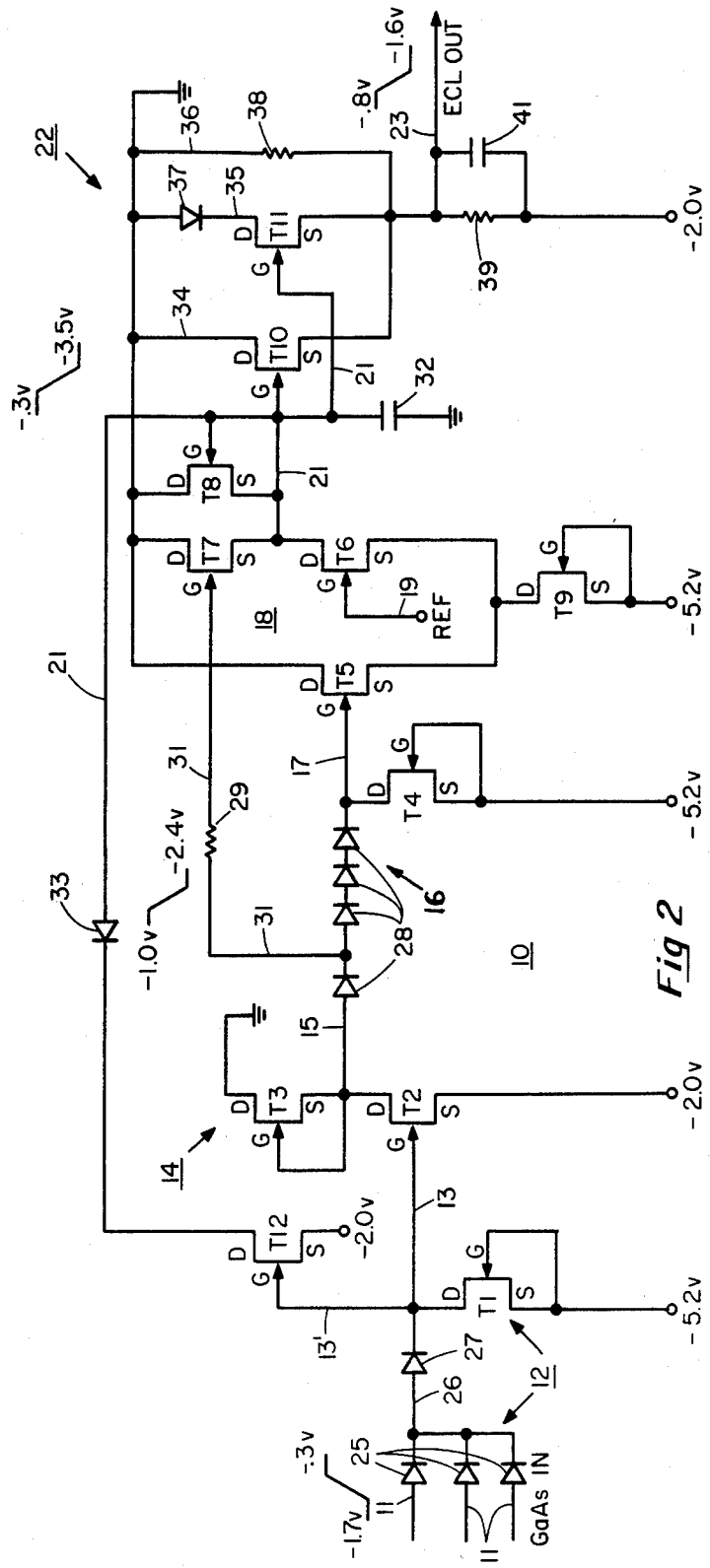

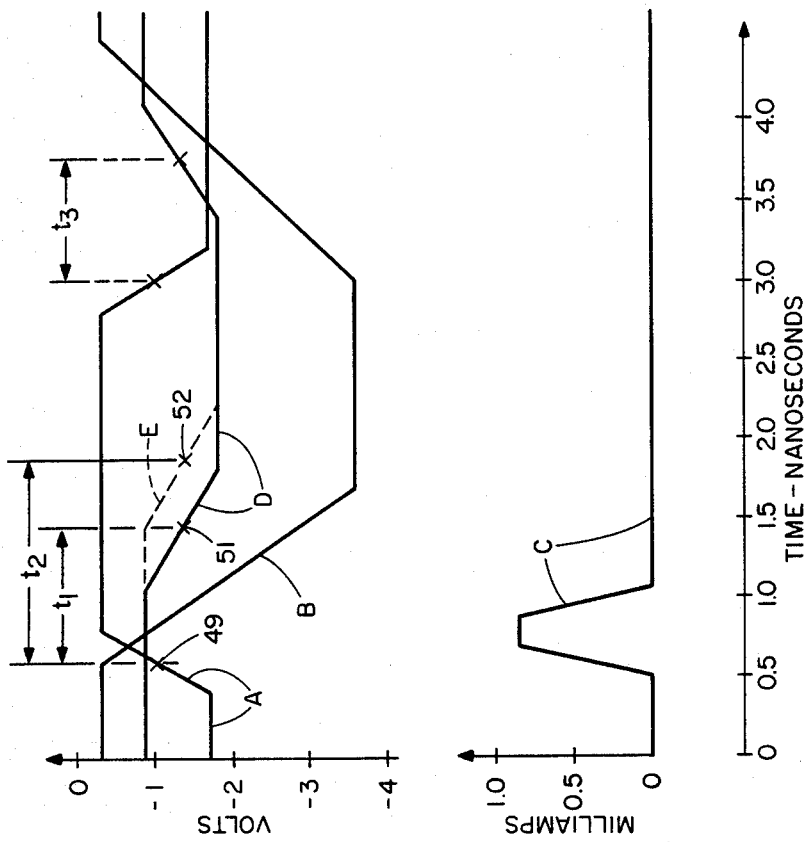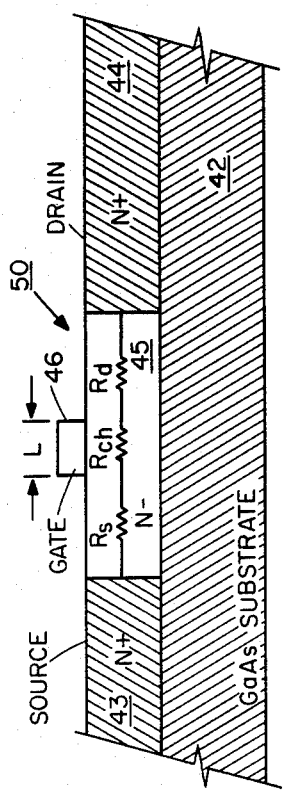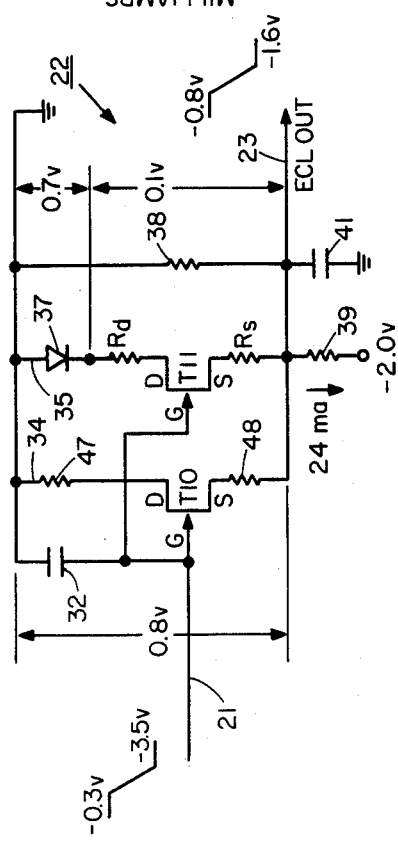

4,496,856

GAAS TO ECL LEVEL CONVERTER

BACKGROUND OF THE INVENTION

1. Related Applications

This invention relates to our copending application Ser. No. 305,320 filed Sept. 24, 1981, U.S. Pat. No. 4,410,815, and entitled "Gallium Arsenide To Emitter Coupled Logic Level Converter".

2. Field of the Invention

This invention is related to the conversion of gallium arsenide (GaAs) Schottky diode field effect logic (SDFL) voltage levels to voltage levels which are compatible with commercially available state of the art silicon base bipolar emitter coupled logic (ECL) circuits.

3. Description of the Prior Art

When electronic equipment such as computers and associated equipment are manufactured, it is often desirable to employ different types or families of integrated circuits. It is known that the logic voltage levels or swings required at the input and produced at the output of different types or families of integrated circuits are not always compatible. Accordingly, some type of voltage conversion and/or power conversion device is required for proper operation.

In our copending application Ser. No. 305,320 it was explained that it is desirable to provide the voltage converter or translator on the same integrated circuit GaAs chip with the associated GaAs logic circuitry. Further, in this copending application, logic circuits of a high speed computer may combine GaAs logic integrated circuits with ECL logic integrated circuits. Since the GaAs logic elements operate at approximately one order of magnitude faster than typical ECL logic circuits, the converter or translator is best incorporated into the GaAs integrated circuit.

When the translator or converter is implemented on the GaAs integrated circuit, part of the circuit area of the chip as well as part of the power consumed by the chip is devoted to the logic converter, accordingly, it is desirable that the output converter portion of the GaAs integrated circuit be as small and as efficient as possible.

SUMMARY OF THE INVENTION

It is a principal object of the present invention to provide a new and improved GaAs to ECL voltage level converter.

It is another principal object of the present invention to provide a novel GaAs output circuit which emulates the operation of an ECL output driving circuit.

It is another object of the present invention to provide a GaAs to ECL voltage level converter which consumes less power, yet provides an improved speed-power product performance characteristic.

It is another object of the present invention to provide a GaAs to ECL voltage level converter which requires less integrated circuit area.

It is another object of the present invention to provide a GaAs to ECL voltage level converter which has higher input impedance and requires less input signal current.

According to these and other objects of the present invention, there is provided a novel GaAs to ECL voltage level converter having a novel gate discharge network which reduces switching delays and a novel output driving circuit which emulates the operation of an ECL driving circuit. The novel emulator comprises three branches which require less integrated circuit area than prior art single branch output driving circuits.

BRIEF DESCRIPTION OF THE DRAWINGS

FIG. 1 is a schematic block diagram of the preferred embodiment GaAs to ECL voltage level converter;

FIG. 2 is a circuit diagram of the preferred embodiment converter shown in FIG. 1;

FIG. 3 is a schematic drawing in enlarged cross-section of the construction of a typical prior art GaAs metal semiconductor field effect transistor (MESFET) employed to explain the present invention;

FIG. 4 is a more detailed circuit diagram of the emulator of FIG. 2 employed to explain the present invention improvement; and FIG. 5 is a timing diagram showing voltage and current waveforms associated with points of the circuit of FIG. 2.

DESCRIPTION OF THE PREFERRED EMBODIMENT

In the preferred embodiment converter 10 shown in FIG. 1, one or more GaAs logic level signals are applied to input lines 11. Signals on lines 11 are applied to level shift and logic circuitry 12 to effectively provide a lower logic voltage level on line 13 which is applied to amplifier and inverter circuit 14. The amplified and inverted signal on line 15 is shifted down in level shifting network 16 to a preferred logic level for input line 17 to differential amplifier 18. Reference voltage line 19 is connected to the negative input side of differential amplifier 18. The reference voltage (not shown) in its simplest form is a fixed voltage level, but could be a signal voltage which enhances the amplified voltage on amplifier output line 21. The logic voltage levels or swings on amplifier output line 21 are designed to provide very large voltage swings in comparison to standard GaAs output voltage swings and are also large in comparison to standard typical ECL voltage swings.

The amplified voltage signal on line 21 is applied to the novel ECL emulator 22 which converts the large voltage swings on line 21 to standard or typical ECL logic voltage swings on ECL output line 23. Emulator 22, as will be explained in detail hereinafter, requires less input power yet switches faster than previous converters. Further, the area of the integrated circuit chip devoted to the ECL emulator 22 is smaller than previous GaAs converters. Amplifier output line 21 is also connected to a novel gate discharge network 24 which is employed to enhance the switching speed of emulator 22. Gate discharge network 24 is connected via input line 13' to the level shifting and logic circuit 12.

Refer also to FIG. 2 showing a simplified circuit embodiment of the converter 10. Input lines 11 are shown connected to diodes 25 which form an OR gate. It will be understood that the level shifting and logic circuit 12 may comprise more complex circuitry which performs more complex logic functions that are not a part of the present invention. The output of diodes 25 on line 26 is connected to level shifting diode 27. The output from diode 27 on line 13 is applied to pull down transistor T1. Thus, voltage logic levels of −1.7 volts and −0.3 volts applied to input lines 11 will appear as voltage swings which are 1.4 volts lower on line 13 due to the voltage drops across diodes 25 and 27 and a supply voltage of −5.2 volts at the source of T1.

The output of level shifting and logic circuit 12 on line 13 is applied to the gate of amplifying transistor T2 of amplifier and inverter 14. The drain of transistor T2 is connected to the source of current source load transistor T3. Transistor T3 could be replaced by a load resistor with an accompanying loss in the speed of operation.

The signal on line 15 is preferably shifted down by four diodes 28 of level shifting network 16 to provide the positive input on line 17 to differential amplifier 18. Line 17 is connected through pull down transistor T4 to a GaAs power supply voltage of −5.2 volts.

Differential amplifier 18 comprises transistors T5, T6, T7, T8 and T9 as well as current limiting resistor 29 in line 31. Transistors T5 and T6 are input transistors which perform the function of differential amplification. Transistor T7 is a controlled current source load transistor and transistor T8 is a current source load transistor which together performs the function of providing an active variable load for the differential amplifier 18 which enhances its speed of operation. The current source pull down transistor T9 is connected between the sources of transistors T5 and T6 and the supply voltage at −5.2 volts. The pull down transistors T1, T4 and T9 all provide a current flow path to the voltage supply at −5.2 volts.

The output signal on amplifier output line 21 is connected to emulator 22 which is shown having a parasitic capacitance 32. This capacitance 32 is also the effective gate capacitance of transistors T10 and T11 of emulator 22. It is well known that the magnitude or value of parasitic capacitance 32 is a function of the voltage on line 21. Thus, when the voltage on line 21 increases, the capacitance 32 also increases. The logic voltage swings on line 21 are preferably from a high of −0.3 volts to a low of −3.5 volts. When a high to low transition occurs on line 21, the current flowing through transistor T6 includes two components, one from the capacitor 32 and the other from the active load T7, T8. Limiting resistor 29 is employed to limit the current in line 31 to the gate of transistor T7 of active load T7, T8 in the low state condition. Effectively, T7 is turned OFF during the high to low transition on line 21 which causes a larger amount of current to be supplied through transistor T6 from capacitor 32 when transistor T6 switches ON. The speed of switching operation of emulator 22 depends on the speed with which capacitor 32 can be discharged after transistor T6 starts switching ON. By limiting the current flow in transistor T7 and increasing the current flow from capacitor 32, the speed of operation of emulator 22 is substantially enhanced.

The limiting resistor 29 also enhances the speed of operation of the emulator 22 during a low to high transition on line 21. The low to high voltage on line 31 causes transistor T7 to turn ON earlier and to drive harder while capacitor 32 is being charged. Thus, the rate of change of the voltage on line 21 is increased as capacitor 32 is charged faster.

Amplifier output line 21 is shown coupled to diode 33 and transistor T12 of gate discharge network 24. When a high to low transition is occurring on line 21, the speed of operation of emulator 22 is enhanced when capacitor 32 is discharged faster. The high to low transition on line 21 results from a low to high transition on input lines 11. This low to high signal on lines 13 and 13′ appears at the gate of transistor T12 and drives it into the conducting or ON state from the OFF state. Since transistor T12 turns ON early, it effectively bypasses the logic delays in elements 14, 16 and 18 and starts to discharge capacitor 32 in anticipation of the high to low transition on line 21. The rate of switching of emulator 22 is a function of the voltage on line 21 at capacitor 32, thus, premature lowering of the voltage on capacitor 32 further enhances the switching speed of emulator 22.

The voltage swings on amplifier output line 21 are shown as being between −0.3 volts and −3.5 volts. These voltage swings are larger than standard GaAs logic voltage swings or typical ECL logic voltage swings for the preferred embodiment of the present invention. As long as the ECL voltage swings on the ECL output line 23 are within the standard recommended ranges, such as −0.8 volts to −1.6 volts, the voltage swings on line 21 can be varied.

When the voltage on line 21 is at −0.3 volts, both transistors T10 and T11 are ON. When transistor T10 is ON, it is designed so that it alone is incapable of driving ECL output line 23 to a logic high of −0.8 volts. Current supply branch 34 supplies current to the load via line 23. High voltage level control branch 35 supplies current to the load and also defines the highest voltage level on output line 23. Diode 37, in series with transistor T11 in branch 35, serves to drop the voltage in branch 35 which otherwise would be small.

Low voltage control branch 36 contains a voltage dividing resistor 38 which serves to define the low voltage state when transistors T10 and T11 are switched OFF.

In the preferred embodiment shown in FIG. 2, ECL output line 23 is adapted to drive an external load of 50 ohms such as a standard 50 ohm coaxial cable. Accordingly, termination resistor 39 is preferably a 50 ohm external resistor and not provided on the GaAs integrated circuit chip. Thus, the "load" connected to the emulator 22 is preferably external to the chip and provides a characteristic impedance of 50 ohms.

A typical load comprises coaxial cable 23, termination resistor 39 and the input capacitance 41 of the ECL load (not shown).

Refer now to FIG. 3 showing a GaAs substrate 42 on which a GaAs MESFET device has been constructed. The source 43 and drain 44 are heavily N+ doped implant regions. The channel implant region 45 is lightly N− doped by approximately one order of magnitude less than the N+ implant regions. The gate 46 is deposited on top of the channel implant 45 to complete the Schottky diode MESFET structure. The length of the gate "L" is preferably made as small as the physical process and process equipment allows. The length "L" can be made about one micron long, however, due to the inability to deposit the gate 46 exactly on top of channel implant area 45, the channel implant 45 must be made longer by an order of two to five times to produce consistent operable devices. The typical resistance of the channel implant region 45 is ten times greater than the source region 43 and drain region 44. Shown schematically within the channel implant region 45 is the channel resistance $R_{ch}$ which can be raised to near infinite resistance when the electric field depletes the channel 45 causing the device 50 to be turned OFF. When the device 50 is ON, current flows from drain 44 to source 43 through the channel resistance $R_{ch}$ as well as through the parasitic drain resistance $R_d$ and source resistance $R_s$.

It is impossible to completely eliminate the parasitic resistances $R_d$ and $R_s$ which cause undesirable voltage drops, limit current flow in the device 50 and slows down the speed of switching of the device. The parasitic resistances $R_d$ and $R_s$ cannot be reduced below the physical limitation of the process employed to make the device 50, however, compensation for such resistance has been found to be applicable.

Refer now to FIG. 4 showing a more detailed circuit diagram of the emulator 22. The parasitic resistances $R_s$ and $R_d$ are shown in the high level voltage control branch 35 which determines the high voltage level. When the device 50 (represented by transistor T11) is ON, the ECL output line 23 is high and at −0.8 volts. The termination voltage which is employed at termination resistance 39 is −2.0 volts, thus, a minimum current across resistance 39 is −2.0−(−0.8) volts divided by 50 ohms or 24 milliamperes.

Since the load current on ECL output line 23 is negligible compared to the 24 milliamperes flowing through termination resistor 39, this additional required current can be ignored for purposes of this explanation. If the total required current is produced in high level voltage control branch 35, the voltage drop across the parasitic resistances $R_d$ and $R_s$ become excessive and the high voltage level of −0.8 volts become dificult to obtain. Transistor T11 could be made very large which would require a large area on the chip and would also require higher power input gate signals. The net result would be slower switching of emulator 22. Transistor T10 in current supply branch 34 is made smaller than transistor T11, however, the voltage across transistor T10 is 0.8 volts whereas the voltage across transistor T11 is only 0.1 volts. Thus, transistor T10 is capable of supplying up to eight times the amount of current as transistor T11 per unit of area. Transistor T10 is designed to supply the major portion of the current across termination resistor 39 without driving ECL output line 23 too high. Even though transistor T10 also has parasitic resistances 47 and 48 at the drain and source, the resistance effect is overcome by the much larger voltage (0.8 volts) across branch 34.

As previously explained, the ECL emulator 22 is designed to appear to the load circuitry as an ECL driver. The ECL driver which is emulated includes a base to emitter junction which operates as a diode. To effectively emulate an ECL driver and to provide the ECL voltage levels on ECL output line 23, a diode 37 is placed in the drain side of branch 35. Diode 37 provides the voltage drop equivalent to an ECL base to emitter junction. By placing the diode 37 in the drain side of branch 35, the channel resistance $R_{ch}$ of transistor T11 is minimized when device 50 is ON, thus, the area of the device 50 (T11) is also minimized.

The parasitic capacitance 32 is the capacitance of the transistors T10 and T11 which is present between the gate 46 and the channel 45 as shown in FIG. 3. When the size of transistors T10 and T11 is minimized, the area of the gates and the capacitance 32 is also minimized. When the capacitance 32 is made smaller, the MESFET device switches faster.

Refer now to FIG. 5 showing the timing waveforms associated with the circuits of FIGS. 1 and 2. Waveform A is presented at input lines 11 as a standard GaAs signal which causes waveform B to be produced on amplifier output line 21. As the voltage on waveform A rises to the fifty percent point 49, it activates the gate discharge network 24 causing current to flow through network 24 from capacitor 32. Waveform C shows this current flow which appears through transistor T12. Waveform D is produced on ECL output line 23 when there is a gate discharge network 24. Waveform E, shown in phantom lines, is the change effected on waveform D when the gate discharge network 24 is not included in the circuits of FIGS. 1 and 2. Point 51 on waveform D is the fifty percent point representative of the switching point. Point 52 on waveform E is where the fifty percent point switching point would be without the gate discharge network 24. Thus, it can be seen graphically that the high to low switching time $t_1$ with network 24 in the circuit is much less than the switching time $t_2$ without network 24. The gate discharge network 24 does not effect the low to high switching time $t_3$.

Having explained a preferred embodiment of the present invention, it will be understood that a new and improved GaAs to ECL voltage level converter has been explained. Employing the structure and features of the present invention, the converter can be made with an improved speed-power product employing reduced chip circuit area. The novel structure enables the designer to increase power which also increases speed. Conversely, both power and delay may be reduced while gaining a further reduction in chip circuit area.

We claim:

1. A gallium arsenide (GaAs) level converter for driving an emitter coupled logic (ECL) circuit comprising:
   a GaAs signal input source,
   a GaAs level shifting network coupled to said signal input source,
   a GaAs differential amplifier having an input coupled to said level shifting network and having an output,
   a voltage reference source coupled to said differential amplifier,
   an emitter coupled logic bipolar emitter follower emulator circuit coupled to the output of said differential amplifier,
   said emitter coupled logic emulator comprising an output stage having,
   a current supply branch,
   a high voltage level control branch, and
   a low voltage level control branch,
   said branches being connected in parallel,
   a termination resistor in series with said branches, and
   an emitter coupled logic output line intermediate said termination resistor and said branches of said emulator.

2. A GaAs level converter as set forth in claim 1 wherein said high voltage level control branch of said emulator comprises a GaAs diode and a GaAs transistor in series with said termination resistor.

3. A GaAs level converter as set forth in claim 2 wherein said current supply branch comprises a GaAs transistor in parallel with said high voltage level control branch.

4. A GaAs level converter as set forth in claim 1 wherein said low voltage level control branch comprises a resistor in series with said termination resistor.

5. A GaAs level converter as set forth in claim 1 wherein said GaAs signal input source includes a level shifting and logic circuit and an amplifying and inverting circuit coupled to said level shifting network.

6. A GaAs level converter as set forth in claim 5 which further includes a gate discharge network coupled between said level shifting and logic circuit and the output of said differential amplifier.

7. A GaAs level converter as set forth in claim 6 wherein said gate discharge network comprises a transistor and a diode in series.

8. A GaAs level converter as set forth in claim 6 wherein said differential amplifier output comprises a positive side and a negative side and wherein said level shifting network is coupled to the positive side of said differential amplifier and the negative side of said differential amplifier is coupled to said voltage reference source.

9. A GaAs level converter for driving an emitter coupled logic (ECL) circuit comprising:
   a level shifting and logic input network for receiving GaAs logic level inputs,
   an amplifying and inverting circuit having an input and an output, said input being coupled to said level shifting and logic input network,
   a differential amplifier having an input and an output, said input being coupled to the output of said amplifying and inverting circuit,
   a gate discharge network coupled to the output of said differential amplifier and to said level shifting and logic input network,
   an ECL bipolar emitter follower emulator circuit couple to the output of said differential amplifier, and
   an ECL signal level output line coupled to said ECL bipolar emitter follower emulator circuit for providing ECL compatible logic voltage levels.

10. A GaAs level converter as set forth in claim 9 wherein said ECL bipolar emitter follower emulator circuit comprises an output stage having,
   a current supply branch,
   a high voltage level control branch, and
   a low voltage level control branch,
   said branches being connected in parallel,
   a termination resistor connected in series with said branches, and wherein said ECL output line being connected intermediate said termination resistor and said branches.

* * * * *